(12) United States Patent
Darmawikarta et al.

(10) Patent No.: US 12,347,788 B2
(45) Date of Patent: Jul. 1, 2025

(54) GLASS SUBSTRATES HAVING SIGNAL SHIELDING FOR USE WITH SEMICONDUCTOR PACKAGES AND RELATED METHODS

(71) Applicant: Intel Corporation, Santa Clara, CA (US)

(72) Inventors: Kristof Darmawikarta, Chandler, AZ (US); Srinivas V. Pietambaram, Chandler, AZ (US); Kemal Aygun, Tempe, AZ (US); Telesphor Kamgaing, Chandler, AZ (US); Zhiguo Qian, Chandler, AZ (US); Jiwei Sun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 754 days.

(21) Appl. No.: 17/485,045

(22) Filed: Sep. 24, 2021

(65) Prior Publication Data
US 2023/0103183 A1 Mar. 30, 2023

(51) Int. Cl.
*H01L 21/48* (2006.01)
*H01L 23/498* (2006.01)
*H01L 23/552* (2006.01)

(52) U.S. Cl.
CPC .......... *H01L 23/552* (2013.01); *H01L 21/486* (2013.01); *H01L 23/49822* (2013.01); *H01L 23/49827* (2013.01); *H01L 23/49838* (2013.01); *H01L 23/49894* (2013.01)

(58) Field of Classification Search
CPC ............... H01L 21/48; H01L 23/49838; H01L 23/49827; H01L 23/49822; H01L 21/486; H01L 23/552
USPC ....................................................... 174/262
See application file for complete search history.

(56) References Cited

U.S. PATENT DOCUMENTS 9,748,324 B2 * 8/2017 Liao ........................ H01L 28/10

* cited by examiner

*Primary Examiner* — Tremesha W Burns
(74) *Attorney, Agent, or Firm* — Hanley, Flight & Zimmerman, LLC

(57) ABSTRACT

Glass substrates having signal shielding for use with semiconductor packages and related methods are disclosed. An example semiconductor package includes a core layer defining a channel and a through glass via (TGV). The channel at least partially surrounding the TGV. A signal transmission line is provided in the opening and extending through the core layer. An electrically conductive material positioned in the channel. The conductive material to provide electromagnetic shielding to the transmission line.

20 Claims, 10 Drawing Sheets

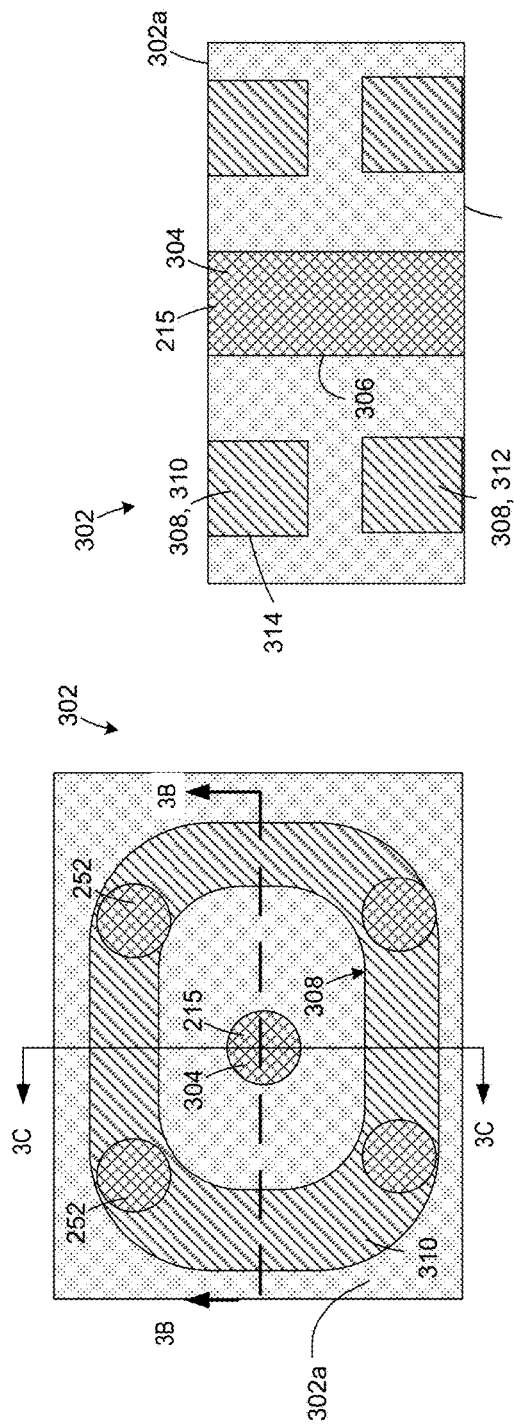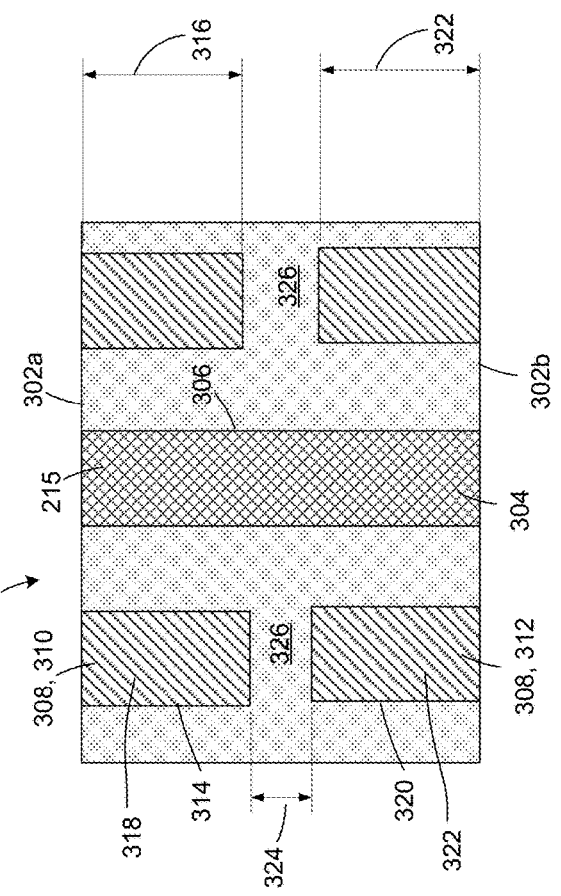

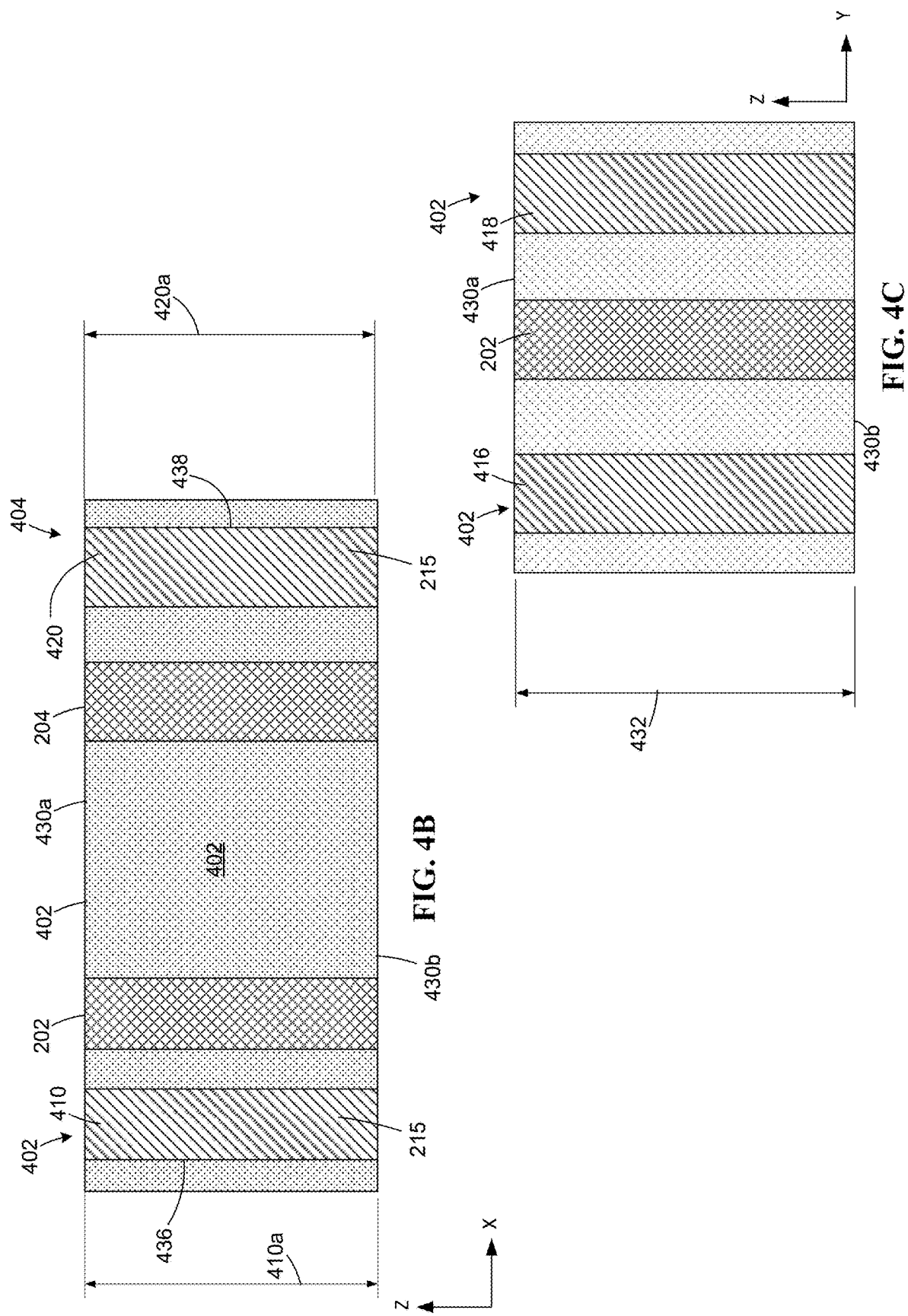

GLASS SUBSTRATES HAVING SIGNAL SHIELDING FOR USE WITH SEMICONDUCTOR PACKAGES AND RELATED METHODS

FIELD OF THE DISCLOSURE

This disclosure relates generally to integrated circuit packaging and, more particularly, to glass substrates having signal shielding for use with semiconductor packages and related methods.

BACKGROUND

Integrated circuits (IC) chips and/or semiconductor dies are routinely connected to larger circuit boards such as motherboards and other types of printed circuit boards (PCBs) via a package substrate. As integrated circuit (IC) chips and/or dies reduce in size and interconnect densities increase, alternatives to traditional substrate layers are needed for providing stable transmission of high frequency data signals between different circuitry.

BRIEF DESCRIPTION OF THE DRAWINGS

FIG. 3A is a partial, enlarged top view of another example glass substrate disclosed herein that can implement the example semiconductor package of FIG. 1.

FIG. 3B is a cross-sectional view of the example glass substrate of FIG. 3A taken along line 3B-3B of FIG. 3A.

FIG. 3C is a cross-sectional view of the example glass substrate of FIG. 3A taken along line 3C-3C of FIG. 3A.

FIG. 4B is a cross-sectional view of the example glass substrate of FIG. 4A taken along line 4B-4B of FIG. 4A.

FIG. 4C is a cross-sectional view of the example glass substrate of FIG. 4A taken along line 4C-4C of FIG. 4A.

Figure 1:
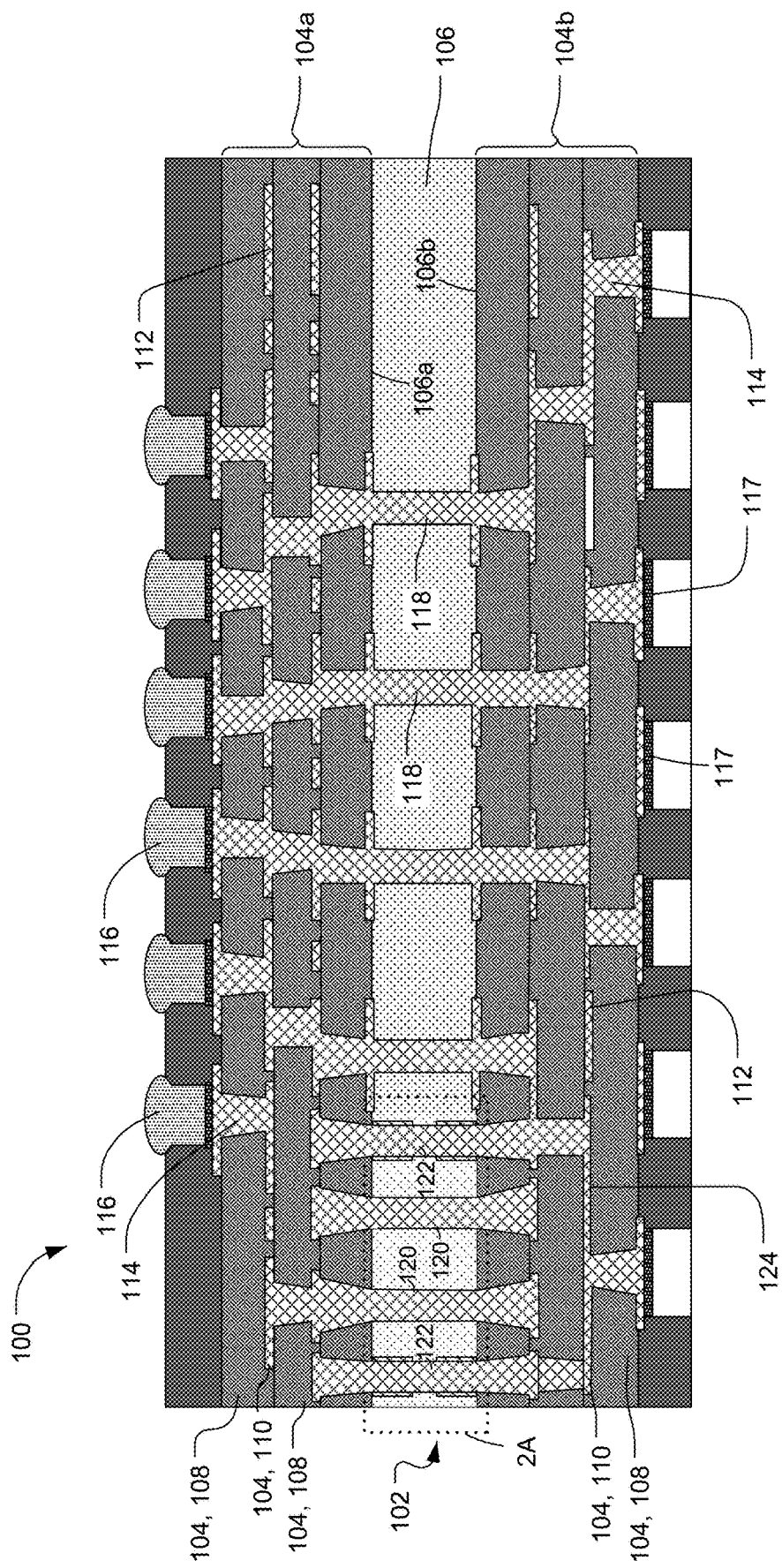
FIG. 1 is a cross-sectional view of an example semiconductor package including an example glass substrate constructed in accordance with teachings of this disclosure.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are provided. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, formed on, created on, or otherwise provided on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc.

DETAILED DESCRIPTION

Some systems can require extremely high-speed frequency links and/or high speed input/output links (e.g., on the order of several hundred gigahertz (GHz) to a terahertz (THz)) between circuitry within a die and/or between different dies of a computing system or semiconductor package. The high bandwidth enables faster processing speeds for bandwidth intensive workloads (e.g., machine learning applications). For instance, the ability to implement high-speed communication links in package structures that are capable of transmitting data rates in the range of Gbps (Gigabits per second) to hundreds of Gbps are advantageous for various types of systems (e.g., radar, imaging, computer server systems, etc.) designed to operate at millimeter-wave frequencies (e.g., between 30 gigahertz (GHz) and 300 gigahertz (GHz)) or higher speed signals having Terahertz frequencies.

To transmit multiple and/or high frequency signals between package components, semiconductor packages often employ planar transmission or signal lines such as microstrip, stripline, and coplanar waveguide transmission lines. However, signal attenuation and frequency dispersion can occur when using such transmission lines to transmit high frequency signals. Thus, high frequency signals transmitted over such transmission lines (e.g., co-planar waveguide, a stripline, a microstrip, etc.) can be lossy.

To improve signal loss and reduce signal, some known semiconductor packages employ metal shielding (e.g., metal shielding to reduce electromagnetic interference (EMI) and radio frequency interference (RFI)). The shielding is typically electrically connected through a build-up interconnect structure to a low impedance ground point to dissipate the EMI and RFI energy. Due to manufacturing limitations, for example, metal shielding often include through hole shielding or stitching vias (e.g., metal filled vias) radially spaced around a transmission or signal line. For example, the stitching vias are cylindrical vias filled with metal that radially spaced around a transmission line. However, to maintain mechanical properties or structure of the substrate or semiconductor package, the stitching vias are spaced apart from each other and, thus, do not fully or completely encapsulate or surround the transmission line. The stitching vias cannot be provided or structured as overlapping or connected vias because doing so would detach a portion of the substrate within a perimeter defined by the connected vias from a portion of the substrate outside of a perimeter defined by the connected vias. Thus, signal loss can occur (e.g., through spaces) between the stitching vias or portions of a substrate package or layer that do not include the stitched vias.

Additionally, advances in semiconductor packaging architectures result in increased demands on the material properties of the package substrate. For example, as package substrates become thinner to achieve a lower profile, a core of the substrate having a small thickness can be susceptible to warping or bending over time, thereby reducing the functionality of the package substrate. For example, for smaller sized package assemblies (e.g., thin or low profile packages for mobile or other devices), a core of the substrate assembly needs to have improved total thickness variation (TTV), lower coefficient of thermal expansion (CTE), lower shrinkage, and higher elastic modulus. To improve such characteristics of a package substrate, glass layers can be employed. In some examples, package substrates can include a layer or substrate made of glass to restrict or prevent the package assembly from warping or bending from its initial manufactured shape over time. The glass substrate can include, for example, a core layer, an interposer and/or any other layer of a semiconductor package.

As used herein, the term "electromagnetic frequency signals" and abbreviation "EM signal(s)" refer to any or all signals with frequencies that fall within the portion of the electromagnetic frequency spectrum that extends from about 5 kilohertz (5 kHz) to about 1 terahertz (1 THz), or greater. As used herein, the term "high speed frequency signals" or "sub-THz EM signals" refer to any or all signals with frequencies that fall within the portion of the electromagnetic frequency spectrum that extends from about 30 GHz to about 1 THz, or more.

Example semiconductor packages disclosed herein can be used with semiconductor dies or chiplets (e.g., tiles) that can implement controllers, microprocessors, Digital Signal Processors (DSPs), Central Processor Units (CPUs), Graphics Processor Units (GPUs), programmed microprocessors, Field Programmable Gate Arrays (FPGAs), Application Specific Integrated Circuits (ASICs), Reduced Instruction Set Computers (RISCs), any other circuitry and/or combinations thereof. Additionally, example semiconductor packages disclosed herein can be used with chiplets of a disaggregated die. Each chiplet (also referred to as a tile) may implement a dedicated function. Together, the chiplets may implement a complex circuitry. The complex circuitry can be any type of device that can be implemented as a plurality of chiplets that are physically separated from, but communicatively coupled to, one another. For example, processor circuitry may be implemented by two or more separate chiplets that together implement a microprocessor, etc. Alternatively, in other examples, example semiconductor packages disclosed herein may be different chips (e.g., a processor circuitry, a memory, and/or or some other type of component) that together implement a system on a chip (SoC) in a semiconductor package.

Examples disclosed herein employ a partial trench or wall to improve through hole shielding in glass substrates. Some example apparatus disclosed herein employ a shielding wall (e.g., metal wall) partially extending in a glass substrate (e.g., in a vertical direction) that encloses or encircles a signal line. In some examples, the shielding wall is electrically coupled to ground. Some example apparatus disclosed herein employ a wall (e.g., a metal wall) that partially enclose a signal line. Some example apparatus disclosed herein employ shielding ground trenches provided at front and rear surfaces of a glass substrate that enclose or encircle center through holes carrying a signal. To electrically ground the shielding walls, some example shielding walls disclosed herein employ through vias that stitch or electrically couple the shielding wall to ground. Some example trenches and/or vias/through holes can be created at a same step with any industry-available glass structuring process and can be filled with copper and/or plugged with resin if a through hole diameter of the via is too large to be completely filled with copper. Example shielding walls disclosed herein can be implemented with other types of substrates including, for example, organic substrates, silicon substrates, etc.

As used herein, "trench" is used to define a channel, opening or recess that can extend partially through a glass substrate or can extend completely through the glass substrate. To this end, in some examples, trench and channel are used interchangeable to define an opening in the glass substrate that partially extends into the glass substrate to provide a bottom surface of the trench located between a first surface (e.g., an upper surface) and a second surface (e.g., a lower surface) of the glass substrate. In some examples, trench and channel are used interchangeable to define an opening in the glass substrate that extends or passes completely through the glass substrate such that a bottom surface of the trench is not formed between a first surface (e.g., an upper surface) and a second surface (e.g., a lower surface) of the glass substrate.

FIG. 1 is a cross-sectional view of an example semiconductor package 100 including an example glass substrate 102 in accordance with teachings of this disclosure. The semiconductor package 100 of the illustrated example includes a plurality of build-up layers 104 and a core layer 106. Specifically, the build-up layers 104 are provided on a first surface 106a of the core layer 106 and a second surface 106b of the core layer 106 opposite the first surface 106a. The build-up layers 104 of the illustrated example are provided in an alternating pattern of insulation or dielectric layers 108 and conductive layers 110 (e.g., patterned electrically) providing a plurality of traces 112 between the dielectric layers 108. The traces 112 of the illustrated example define signal traces (e.g., signaling or transmission lines) to transfer signals or information between various components (e.g., transistors, capacitors, resistors, backend layers, etc. and/or other circuitry) of the semiconductor package 100. Electrically conductive vias 114 (e.g., copper plated vias) extend through the dielectric layers 108 and electrically interconnect the conductive layers 110 (e.g., traces 112) of the different build-up layers 104. In the illustrated example, the semiconductor package 100 includes a plurality of solder connectors 116 (e.g., solder balls) and a plurality of solder pads 117 to electrically couple the semiconductor package 100 to a printed circuit board, an interposer and/or any other substrate(s).

The glass substrate 102 of the illustrated example defines the core layer 106. Thus, the core layer 106 of the illustrated example is composed of glass. The core layer 106 of the illustrated example is positioned between a first plurality 104a of the first build-up layers 104 (e.g., on the first surface 106a of the core layer 106) and a second plurality 104b of the build-up layers 104 (e.g., on the second surface 106b of the core layer 106). To communicatively and/or electrically couple one or more of the first plurality 104a of the build-up layers 104 and one or more of the second plurality 104b of build-up layers 104, the core layer 106 of the illustrated example employs a plurality of through glass vias (TGVs) 118 (e.g., copper plated vias).

Additionally, the glass substrate 102 of the illustrated example includes a plurality of signal lines 120 (e.g., coaxial transmission lines, signal paths, etc.) for transferring or propagating signals between the build-up layers 104 via the glass substrate 102. For example, the signal lines 120 define one or more communication channels or transmission lines (e.g., coaxial transmission lines) to carry an electromagnetic signal communication (e.g., enable EM signals to transmit or transfer) between the first build-up layers 104a and the second build-up layers 104b. Additionally, for shielding the signal lines 120 from interference, the glass substrate 102 of the illustrated example includes a signal shield 122 for signal referencing and improving signal integrity by reducing crosstalk. The signal shield 122 of the illustrated example at least partially surrounds the signal lines 120. The signal shield 122 of the illustrated example is electrically coupled to a ground layer 124 of the semiconductor package 100.

Although the glass substrate 102 of the illustrated example is the core layer 106 of the semiconductor package 100, in some examples, the glass substrate 102 can be an interposer and/or any other layer of the semiconductor package 100. For example, the glass substrate 102 can be used in place of one or more of the dielectric layers 108 of the semiconductor package 100. In some examples, the core layer 106 and/or the glass substrate 102 can be composed of different material(s) including organic materials, silicon and other conventional materials for fabricating substrates.

Figure 2A:
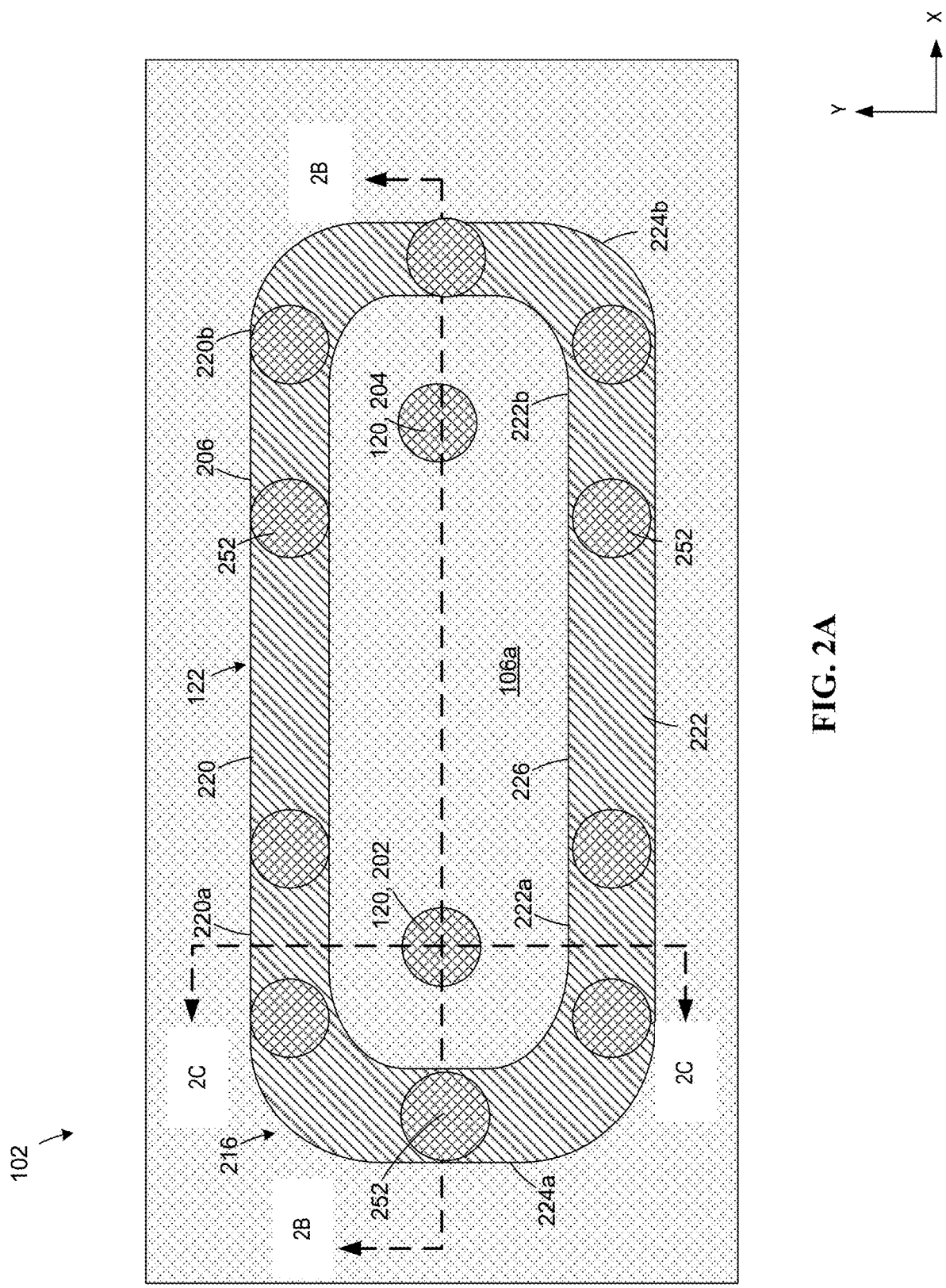
FIG. 2A is a partial, enlarged top view of the example glass substrate of the example semiconductor package of FIG. 1.
Figure 2B:
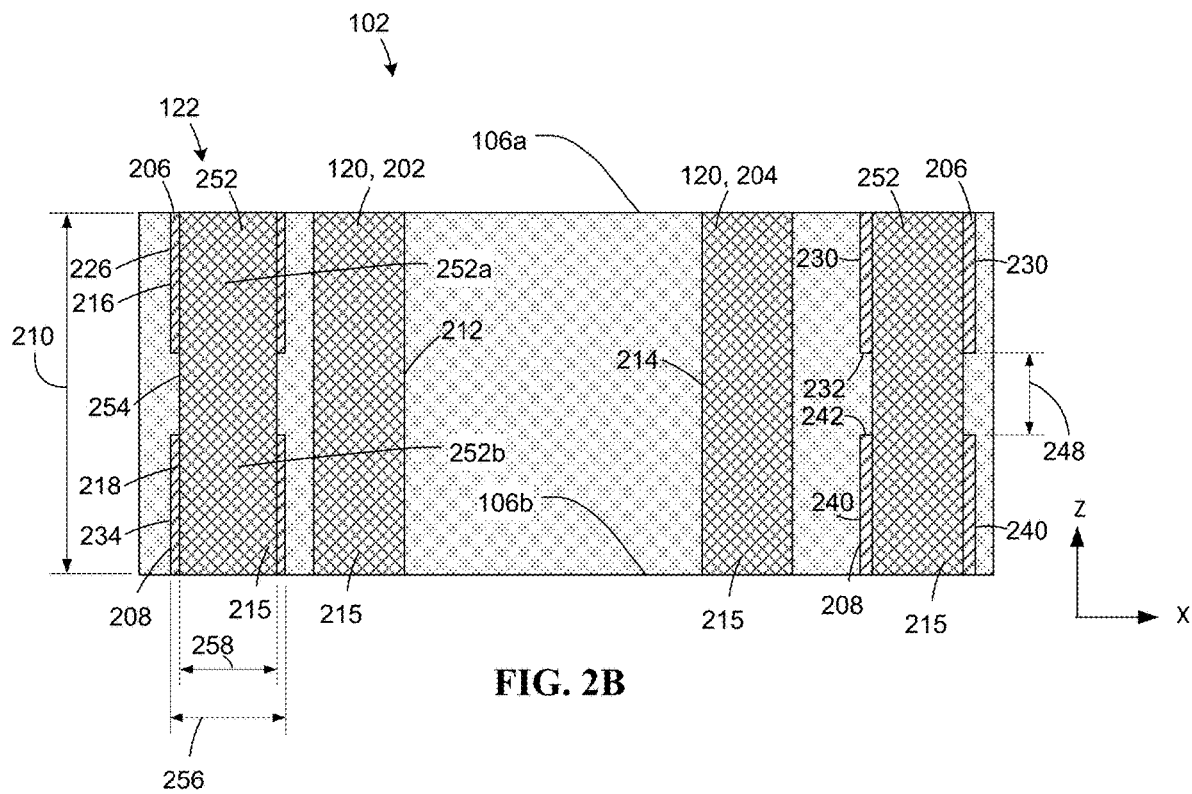
FIG. 2B is a cross-sectional view of the example glass substrate of FIG. 2A taken along line 2B-2B of FIG. 2A.
Figure 2C:
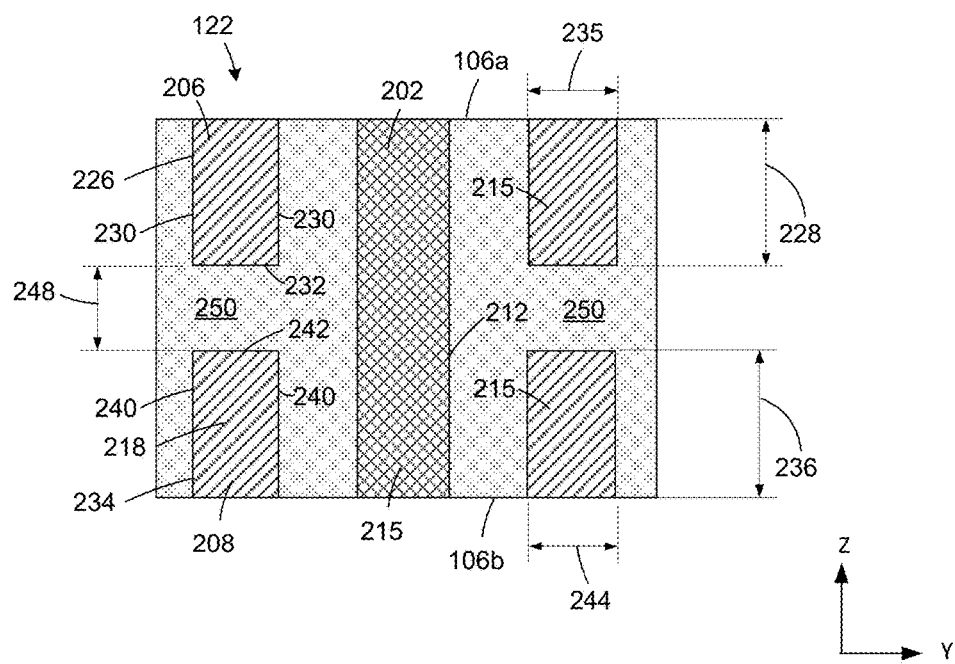
FIG. 2C is a cross-sectional view of the example glass substrate of FIG. 2A taken along line 2C-2C of FIG. 2A.

FIG. 2A is a partial, top view of the semiconductor package 100 of FIG. 1. FIG. 2B is a cross-sectional view taken along lines 2B-2B of FIG. 2A. FIG. 2C is a cross-sectional view taken along lines 2C-2C of FIG. 2A. As noted above, the semiconductor package 100 of the illustrated example includes the signal lines 120 and the signal shield 122. Specifically, the signal lines 120 of the illustrated example includes a first signal line 202 (e.g., a signal path) and a second signal line 204 (e.g., a signal path). The signal shield 122 of the illustrated example includes a first shield 206 and a second shield 208. The first and second shields 206, 208 provide a shielding ground that enclose or encircle the signal lines 120. As further detailed below, the signal lines 120 and the signal shield 122 are provided in the glass substrate 102.

Referring to FIGS. 2A-2C, the glass substrate 102 of the illustrated example has an overall thickness 210 between the first surface 106a and the second surface 106b. In the orientation of FIGS. 2B and 2C, the overall thickness 210 extends in a z-direction of a reference cartesian coordinate system (e.g., a vertical or stack-up/build-up direction in the orientation of FIG. 1). In some examples, the overall thickness 210 can be between 100 micrometers (μm) and 1 millimeter (mm). In some examples, the overall thickness 210 of the illustrated example can be approximately 10 to 50 times greater than a thickness of a build-up layer (e.g., the build-up layers 104 of FIG. 1). The glass substrate 102 of the illustrated example can be composed of glass material(s) including, but not limited to, borosilicate, quartz, fused silica, and/or any other suitable material(s).

To provide the first signal line 202, the glass substrate 102 of the illustrated example includes a first through glass via or opening 212. The first opening 212 extends between the first surface 106a of the glass substrate 102 and the second surface 106b of the glass substrate 102. To from the second signal line 204, the glass substrate 102 of the illustrated example includes a second through glass via or opening 214. The second opening 214 extends between the first surface 106a of the glass substrate 102 and the second surface 106b of the glass substrate 102. The first opening 212 of the illustrated example defines the first signal line 202 and the second opening 214 of the illustrated example defines the second signal line 204. The first opening 212 and the second opening 214 of the illustrated example are cylindrically shaped openings.

To define the first signal line 202 and the second signal line 204, an electrically conductive material 215 is positioned in the first opening and the second opening, respectively. The conductive material 215 of the illustrated example includes, but not limited to, copper, aluminum, gold, metal and/or any other electrically conductive material(s). Thus, the first signal line 202 is defined by the shape of the first opening 212 and the second signal line 204 is defined by the shape of the second opening 214. For example, the first signal line 202 and the second signal line 204 extend between the first surface 106a of the glass substrate 102 and the second surface 106b of the glass substrate 102 (e.g., and each has a cylindrical shape).

The first signal line 202 and the second signal line 204 of the illustrated example are coaxial signal lines and extend in the z-direction of the example cartesian coordinate system. In other words, a longitudinal axis of the first signal line 202 and a longitudinal axis of the second signal line 204 can be oriented in the vertical direction. In the illustrated example, the first signal line 202 (e.g., the first opening 212) of the illustrated example is spaced from the second signal line 204 (e.g., the second opening 214). Additionally, the first signal line 202 is substantially parallel relative to the second signal line 204. As used herein, "substantially parallel" means perfectly parallel or within 5 degrees of perfectly parallel. In some examples, the first signal line 202 and/or the second signal line 204 can be created at an angle (e.g., a 10 degree angle, etc.) between the between the first surface 106a of the glass substrate 102 and the second surface 106b of the glass substrate 102 such that the first signal line 202 (e.g., a longitudinal axis) and/or the second signal line 204 (e.g., a longitudinal axis) extend in the z-direction and at least one of a y-direction or an x-direction of the example cartesian coordinate system.

The first shield 206 and a second shield 208 of the illustrated example surrounds or encloses (e.g., completely surrounds) the first signal line 202 and second signal line 204. The first shield 206 of the illustrated example is a first continuous wall 216 in the glass substrate 102. The second shield 208 of the illustrated example is a second continuous wall 218 in the glass substrate 102. For example, each of the first continuous wall 216 and the second continuous wall 218 of the illustrated example has an oval or oblong shape when viewed in the orientation of FIG. 2A (e.g., in an x-y plane of the cartesian coordinate system). To this end, each of the first continuous wall 216 and the second continuous wall 218 of the illustrated example has a first linear portion 220 (e.g., a straight length portion) spaced from a second linear portion 222 (e.g., a straight length portion). A first arcuate portion 224a joins respective first ends 220a, 222a of the first and second linear portions 220, 222 and a second arcuate portion 224b joins respective second ends 220b, 222b of the first and second linear portions 220, 222.

To define the first shield 206 and/or the first continuous wall 216, the glass substrate 102 of the illustrated example includes a first trench or a first channel 226 (e.g., a first continuous trench, recessed groove or recessed channel). The first channel 226 of the illustrated example is provided in the first surface 106a of the glass substrate 102. Specifically, the first channel 226 partially extends between the first surface 106a and the second surface 106b in the z-direction (e.g., vertical direction). Thus, the first channel 226 is offset (e.g., in the z-direction) from the first surface 106a in a direction away from the first surface 106a and toward the second surface 106b to define a first depth 228. In the orientation of FIGS. 2A-2C, the first depth 228 extends in the z-direction (e.g., a vertical or stack-up/build-up direction in the orientation of FIG. 1). The first channel 226 surrounds the first opening 212 and the second opening 214.

The first channel 226 of the illustrated example includes side walls 230 and a base wall 232 (e.g., a bottom wall). The base wall 232 is offset (e.g., in the z-direction) relative to the first surface 106a. The side walls 230 of the illustrated example are substantially parallel relative to each other and substantially perpendicular relative to the base wall 232 and/or the first surface 106a. As used herein, "substantially parallel" means perfectly parallel or within 5 degrees of perfectly parallel. As used herein, "substantially perpendicular" means perfectly perpendicular (e.g., 90 degree perpendicularity) or within 5 degrees of perfectly perpendicular (e.g., 85 degrees). Thus, the first channel 226 is a continuous trench that provides a first track (e.g., a continuous track) encircling the first signal line 202 and the second signal line 204. In some examples, the side walls 230 can taper from the first surface 106a toward the base wall 232 (e.g., angled walls, 45-degree sloped walls, etc.). Thus, the first depth 228 is defined by a height of the side walls 230 between the first surface 106a and the base wall 232. In other words, the first depth 228 is less than the overall thickness 210. For example, the first depth 228 of the illustrated example can be between 5 micrometers and 200 micrometers (e.g., depending on the thickness 210). Additionally, the first channel 226 of the illustrated example has an example width 224 (FIG. 2C). In the illustrated example, the first channel 226 has a uniform width around a circumference of the first channel 226. In some examples, the width 235 of the first channel 226 can vary (e.g., increase or decrease) along a path defined by the first channel 226.

In the illustrated example, the electrically conductive material 215 is positioned in the first channel 226 to define the first shield 206 and/or first continuous wall 216. For example, the first channel 226 of the illustrated example is filled with the conductive material 215. The conductive material 215, positioned in the first channel 226 of the glass substrate 102, has dimensions or a shape similar to the dimensions and/or the shape of the first channel 226 (e.g., a conductive wall). The conductive material 215 positioned in the first channel 226 provides electromagnetic shielding for one or more signal paths provided by the first signal line 202 and/or the second signal line 204.

Additionally, the conductive material 215 positioned in the first channel 226 of the illustrated example is flush relative to the first surface 106a. In other words, an outer surface of the conductive material 215 of the first channel 226 is substantially flush relative to the first surface 106a such that the conductive material 215 in the first channel 226 does not create a step (e.g., a recess or protrusion or bump) relative to the first surface 106a. As used herein, substantially flush means that the outer surface of the conductive material 215 positioned in the first channel 226 and the first surface 106a are perfectly even (e.g., flat) in the same plane (e.g., a plane in the x-y direction) or slightly offset relative to each within a value not exceeding 2 percent (2%). Thus, a transition between the conductive material 215 of the first channel 226 and the first surface 106a is relatively smooth or uninterrupted.

To define the second shield 208 and/or the second continuous wall 218, the glass substrate 102 of the illustrated example includes a second trench or a second channel 234 (e.g., a second continuous trench or a recessed channel or groove). The second channel 234 of the illustrated example is provided in the second surface 106b of the glass substrate 102. Specifically, the second channel 234 partially extends between the second surface 106b and the first surface 106a in the z-direction (e.g., vertical direction). Thus, the second channel 234 is offset (e.g., in the z-direction) from the second surface 106b in a direction away from the second surface 106b and toward the first surface 106a to define a second depth 236. In the orientation of FIG. 2A, the second depth 236 extends in the z-direction (e.g., a vertical or stack-up/build-up direction in the orientation of FIG. 1).

In particular, the second channel 234 includes side walls 240 and a base wall 242 (e.g., a bottom wall). The base wall 242 is offset (e.g., in the z-direction) relative to the second surface 106b. The side walls 240 of the illustrated example are substantially parallel relative to each other and substantially perpendicular relative to the base wall 242 and/or the second surface 106b. Thus, the second channel 234 provides a second track (e.g., a continuous track) encircling the first signal line 202 and the second signal line 204. In some examples, the side walls 240 can taper from the second surface 106b toward the base wall 242 (e.g., angled walls, 45-degree sloped walls, etc.). Thus, the second depth 236 is defined by a height of the side walls 240 between the second surface 106b and the base wall 242. In other words, the second depth 236 is less than the overall thickness 210. For example, the second depth 236 of the illustrated example can be between 5 micrometers and 200 micrometers (e.g., depending on the overall thickness 210). Additionally, the second channel 234 of the illustrated example has an example width 244 (FIG. 2C). In the illustrated example, second channel 234 has a uniform width around a circumference of the second channel 234. In some examples, the width 244 of the second channel 234 can vary (e.g., increase or decrease) along a path defined by the second channel 234. In the illustrated example, the second channel 234 is substantially similar or identical to the first channel 226. For example, the first depth 228 and the width 235 of the first channel 226 are substantially similar (e.g., within a 2% tolerance) or identical to the second depth 236 and the width 244 of the second channel 234, respectively. However, in some examples, the second channel 234 can be created with a different shape and/or different dimension compared to the first channel 226.

To define the second shield 208 and/or the second continuous wall 218, the electrically conductive material 215 is positioned in the second channel 234. For example, the second channel 234 of the illustrated example is filled with the conductive material 215. The conductive material 215 positioned in the second channel 234 of the glass substrate 102 has dimensions or a shape similar to the dimensions and/or the shape of the second channel 234 (e.g., provides the second continuous wall 218). Additionally, the conductive material 215 of the second channel 234 of the illustrated example is flush relative to the second surface 106b. In some examples, the conductive material 215 of the second channel 234 is not flush relative to the second surface 106b. The conductive material 215 positioned in the second channel 234 provides electromagnetic shielding for one or more signal paths provided by the first signal line 202 and/or the second signal line 204.

The first channel 226 (e.g., the base wall 232) is spaced from the second recesses channel 234 (e.g., the base wall 242) by a gap 248 in the z-direction. In other words, the first channel 226 is isolated from the second channel 234 such that a body 250 of the glass substrate 102 is positioned between the first channel 226 and the second channel 234. Thus, in the illustrated example, the first channel 226 does not extend into the second channel 234 (e.g., in the z-direction). In this manner, the body 250 of the glass substrate 102 between the first channel 226 (e.g., a lowermost surface of the first channel 226 in the orientation of FIG. 2A) and the second channel 234 (e.g., an uppermost surface of the second channel 234 in the orientation of FIG. 2A) maintains a mechanical integrity, stability and/or strength of the glass substrate 102. In other words, although the glass substrate 102 includes the first channel 226 and the second channel 234, the glass substrate 102 maintains a unitary shape or structure.

The glass substrate 102 of the illustrated example includes a plurality of through glass vias or stitch vias 252 (e.g., TGVs). Each of the stitch vias 252 of the illustrated example is provided by an opening 254 (e.g., a cylindrical opening or bore) that passes through the glass substrate 102 within the first channel 226 and the second channel 234. For example, each of the stitch vias 252 includes a first portion 252a passing through the first channel 226 and a second portion 252b passing through the second channel 234. The stitch vias 252 of the illustrated example are positioned between the side walls 230, 240 of the respective first and second channels 226, 234 and are spaced apart around the first signal line 202 and the second signal line 204. Thus, the stitch vias 252 of the illustrated example couple (e.g., electrically couple) the first shield 206 and the second shield 208. In some examples, one or more of the stitch vias 252 can have a square shape, an elongated shape, an oblong shape, a rectangular shape and/or any other shape and/or dimension. In the illustrated example, stitch vias 252 are provided between the first surface 106a and the second surface 106b of the glass substrate 102. In the illustrated example, the stitch vias 252 extend through an entirety of the overall thickness 210 (i.e., in the z-direction) of the glass substrate 102. The stitch vias 252 of the illustrated example can couple to the ground layer 124 of the semiconductor package 100. In the illustrated example, the stitch vias 252 are filled with the conductive material 215. The number of stitch vias 252 (and/or the shape of the stitch vias 252) can be chosen based on the application to restrict or prevent crosstalk and/or interference between the first signal line 202 and the second signal line 204 and other neighboring signal lines. In some examples, the glass substrate 102 does not include the stitch vias 252.

In the illustrated example, the first trench 226 and the second trench 234 each has a width 256 and the stitch vias 252 has a diameter 258. In the illustrated example, the width 256 is greater than the diameter 258. In this manner, the first and second trenches 226, 234 and the stitch vias 252 are provided using a two-step process by creating the first and second trenches 226, 234 and then creating the stitch vias 252. In some examples, the width 256 is substantially similar or identical to the diameter 258. In some such examples, the first trench 226, the second trench 234 and the stitch vias 252 are provided concurrently via a single-step process.

FIGS. 3A-3C, 4A-4C, 5, and 6 illustrate other example glass substrates 302-602 disclosed herein. Many of the components of the example glass substrates 302-602 of FIGS. 3A-3C, 4A-4C, 5, and 6 are substantially similar or identical to the components described above in connection with the glass substrate 102 of FIGS. 1A, 2A and 2B. As such, those components will not be described in detail again below. Instead, the interested reader is referred to the above corresponding descriptions for a complete written description of the structure and operation of such components. To facilitate this process, similar or identical reference numbers will be used for like structures in FIGS. 3A-3C, 4A-4C, 5, and 6 as used in FIGS. 1, 2A-2C. For example, the glass substrates 302-602 of FIGS. 3A-3C, 4A-4C, 5, and 6 includes conductive material 215.

FIG. 3A is a partial, top view of another example glass substrate 302 disclosed herein. FIG. 3B is a cross-sectional view taken along lines 3B-3B of FIG. 3A. FIG. 3C is a cross-sectional view taken along lines 3C-3C of FIG. 3A. The glass substrate 302 of the illustrated example can be used to implement the example semiconductor package 100 of FIG. 1. For example, the glass substrate 302 can implement the core layer 106.

The glass substrate 302 of the illustrated example includes a signal line 304. In contrast to the glass substrate 102 of FIGS. 2A-2C, the glass substrate 302 of the illustrated example includes only one signal transmission line (e.g., a single coaxial line). However, the signal line 304 is otherwise (e.g., dimensioned or shaped) substantially similar or identical to the first signal line of FIGS. 2A-2C. For example, the signal line 304 of the illustrated example is provided by a through glass via or opening 306 of the glass substrate 302. To define the signal line 304, the opening 306 is filled with a conductive material 215.

Additionally, the glass substrate 302 of the illustrated example includes a signal shield 308 that surrounds or encompasses (e.g., completely encircles) the signal line 304. The signal shield 308 of the illustrated example is substantially similar to the signal shield 122 of FIGS. 1, 2A-2C. For example, the signal shield 308 includes a first shield 310 and the second shield 312. The first shield 310 and the second shield 312 are provided substantially similar to the first shield 206 and the second shield 208 of FIGS. 2A-2C. For example, the first shield 310 and the second shield 312 each has an oblong shape. The first shield 310 is defined by a first recessed channel 314 provided in the first surface 106a of the glass substrate 302. The first recessed channel 314 partially extends between a first surface 302a and a second surface 302b in the z-direction (e.g., vertical direction) by a first depth 316.

The first recessed channel 314 is a trench that at least partially surrounds the opening 306. In the illustrated example, the first recessed channel 314 is a continuous or uninterrupted groove or trench provided in the first surface 302a. To define the first shield 310, the first recessed channel 314 is filled with the conductive material 215. The conductive material 215, positioned in the first recessed channel 314, defines a first continuous wall 318 (e.g., a continuous conductive wall). The conductive material 215 positioned in the first recessed channel 314 provides electromagnetic shielding to the signal line 304.

The second shield 312 is provided by a second recessed channel 320 provided in the second surface 302b of the glass substrate 302. The second recessed channel 320 partially extends between the second surface 302b and the first surface 302a in the z-direction (e.g., vertical direction) by a second depth 236. The second recessed channel 320 is a continuous or uninterrupted groove or trench provided in the second surface 306b. To define the second shield 312, the second recessed channel 320 is filled with the conductive material 215. The conductive material 215, positioned in the second recessed channel 320, defines a second continuous wall 322 (e.g., a continuous conductive wall). The conductive material 215 of the second recessed channel 320 provides electromagnetic shielding to the signal line 304.

The first recessed channel 314 and/or the first shield 310 of the illustrated example is spaced from the second recessed channel 320 or the second shield 312 by a gap 324 in the z-direction. In other words, the first recessed channel 314 is isolated from the second recessed channel 320 such that a body 326 of the glass substrate 302 is positioned between the first recessed channel 314 and the second recessed channel 320. Thus, in the illustrated example, the first recessed channel 314 does not extend into the second recessed channel 320. Additionally, the glass substrate 302 of the illustrated example can include a plurality of through stitch vias 252 (e.g., through glass vias) (e.g., substantially similar or identical to the stitch vias of FIGS. 2A-2C). In some examples, the glass substrate 302 does not include the stitch vias 252. In some examples, the glass substrate 302 of the illustrated example can be provided with the first shield 206 and the second shield 208 of FIGS. 2A-2C.

Figure 4A:
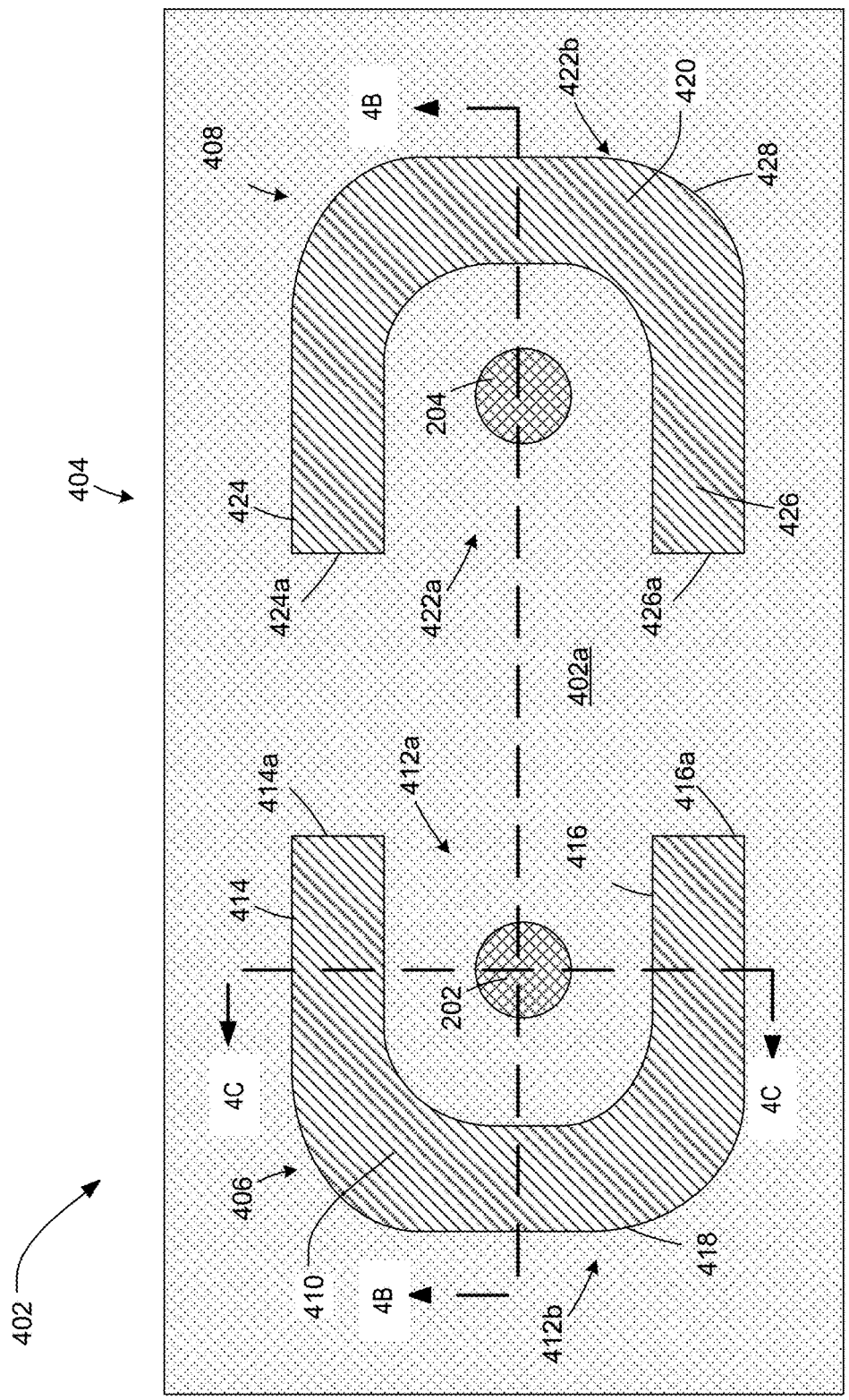
FIG. 4A is a partial, enlarged top view of another example glass substrate disclosed herein that can implement the example semiconductor package of FIG. 1.

FIG. 4A is a partial, top view of another example glass substrate 402 disclosed herein. FIG. 4B is a cross-sectional view taken along lines 4B-4B of FIG. 4A. FIG. 4C is a cross-sectional view taken along lines 4C-4C of FIG. 4A. The glass substrate 402 of the illustrated example can be used to implement the example semiconductor package 100 of FIG. 1. The glass substrate 402 of the illustrated example includes a first signal line 202 and a second signal line 204. Additionally, the glass substrate of the illustrated example includes a signal shield 404 to improve signal integrity and shielding for the first signal line 202 and the second signal line 204.

The signal shield 404 of the illustrated example includes a first shield 406 and a second shield 408. In the illustrated example, the first shield 406 is separated from the second shield 408. For example, the first shield 406 is isolated (e.g., electrically isolated) from the second shield 408. In the illustrated example, a body or core 402a of the glass substrate 402 is positioned between the first shield 406 and the second shield 408 for improved mechanical integrity and/or stability.

In contrast to the glass substrate 102 of FIGS. 2A-2C, the first shield 406 of the illustrated example is a first wall 410 that partially surrounds the first signal line 202. Thus, the first wall 410 of the illustrated example has a first open end 412a. In the illustrated example, the first wall 410 has a C-shape pattern in the orientation of FIG. 4A. Specifically, the first wall 410 includes a first leg 414 defining a first end 414a, a second leg 416 defining a second end 416a, and an arcuate portion 418 between (e.g., interconnecting) the first leg 414 and the second leg 416 to define a first closed end 412b. The first leg 414 and the second leg 416 of the illustrated example have a straight profile (e.g., extending in the x-direction of the example cartesian coordinate system) and the arcuate portion 418 has a curved or circular profile (e.g., interconnecting the first leg 414 and the second leg 416). The body 402a of the glass substrate 402 surrounds (e.g., completely encompasses) the first wall 410 and/or the first shield 406. Additionally, the first signal line 202 is spaced from the first wall 410. Thus, the body 402a of the glass substrate 402 is positioned (e.g., defines material) between the first wall 410 and the first signal line 202. In the illustrated example, the first leg 414 and the second leg 416 are substantially parallel and/or have the same length. The first leg 414 and the second leg 416 extend past or beyond the first signal line 202 so that the first leg 414 and the second leg 416 and/or the first wall 410 overlaps the first signal line 202 (e.g., in the xy-direction). However, the first wall 410 does not overlap and/or encircle the second signal line 204. In other words, the first wall 410 is spaced from the second signal line 204 (e.g., does not shield the second signal line 204).

Likewise, the second shield 408 of the illustrated example is a second wall 420 that partially surrounds (e.g., partially encircles) the second signal line 204. Thus, the second wall 420 of the illustrated example has a second open end 422a. In the illustrated example, the second wall 420 has an a C-shape pattern in the orientation of FIG. 4A. Specifically, the second wall 420 includes a first leg 424 defining a first end 424a, a second leg 426 defining a second end 426a, and an arcuate portion 428 between (e.g., interconnecting) the first leg 424 and the second leg 426 to define a second closed end 422b. The first leg 424 and the second leg 426 of the illustrated example have a straight profile (e.g., extending in the x-direction of the example cartesian coordinate system) and the arcuate portion 428 has a curved or circular profile (e.g., interconnecting the first leg 424 and the second leg 426). The body 402a of the glass substrate 402 surrounds (e.g., completely encompasses) the second wall 420 and/or the second shield 408. Additionally, the second signal line 204 is spaced from the second wall 420. Thus, the body 402a of the glass substrate 402 is positioned (e.g., defines material) between the second wall 420 and the second signal line 204. In the illustrated example, the first leg 424 and the second leg 426 are substantially parallel and/or have the same length. The first leg 424 and the second leg 426 extend past or beyond the second signal line 204 so that the first leg 424 and the second leg 426 and/or the second wall 420 overlaps the second signal line 204 (e.g., in the xy-direction). However, the second wall 420 does not overlap and/or encircle the first signal line 202. In other words, the second wall 420 is spaced from the first signal line 202 (e.g., does not shield the first signal line 202).

In the orientation of FIG. 4A, the first open end 412a is oriented toward the second open end 422a. For example, this orientation of the first open end 412a facing the second open end 422a is beneficial when differential signals are carried or propagated by the first signal line 202 and the second signal line 204. The first signal line 202 is at least partially surrounded by the first wall 410 and the second signal line 204 is at least partially surrounded by the second wall 420. The body 402a of the glass substrate 402 is provided between the first open end 412a and the second open end 422a.

Referring to FIGS. 4B-4C, the first wall 410 extends between a first surface 430a of the glass substrate 402 and a second surface 430b of the glass substrate 402 in the z-direction (e.g., a vertical or stack-up direction in the orientation of FIGS. 4A-4C). For instance, the glass substrate 402 of the illustrated example has an overall thickness 432. The first wall 410 and the second wall 420 extend completely (e.g., though the entire overall thickness 432) between the first surface 430a and the second surface 430b in the z-direction. Thus, an overall thickness 410a of the first wall 410 and an overall thickness 420a of the second wall 420 is equal to the overall thickness 432 of the glass substrate 402.

To provide the first wall 410, the glass substrate 402 includes a first trench or channel 436. The first channel 436 is provided between the first surface 430a and the second surface 430b (e.g., completely through the glass substrate 402). For example, the first channel 436 is a through-channel or through-hole passing through the glass substrate 402. To provide the first wall 410, a conductive material 215 is positioned in the first channel 436. Similarly, to provide the second wall 420, the glass substrate 402 includes a second trench or channel 438. The second channel 438 is provided between the first surface 430a and the second surface 430b (e.g., completely through the glass substrate 402). For example, the second channel 438 is a through-channel or through-hole passing through the glass substrate 402. To provide the second wall 420, a conductive material 215 is positioned in the second channel 438. The conductive material 215 of the second channel 438 and/or the first wall 410 can be flush with the first surface 430a and the second surface 430b. Likewise, the conductive material 215 of the second channel 438 and/or the second wall 420 can be flush relative to the second surface 430b.

Figure 5:
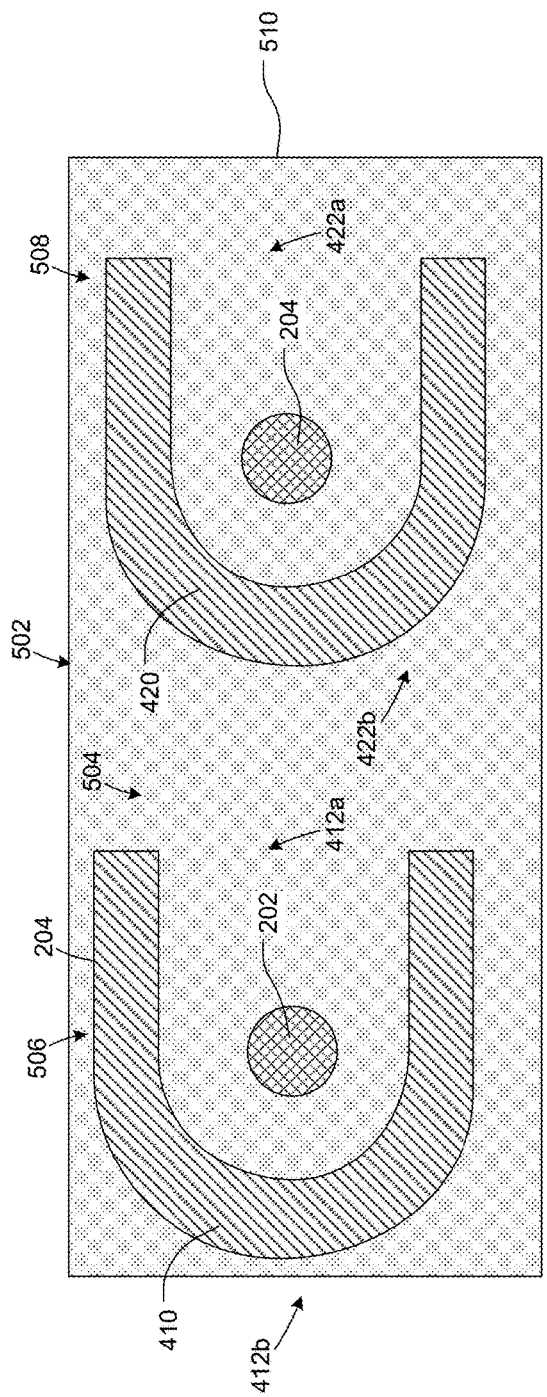
FIG. 5 is a partial, enlarged top view of another example glass substrate disclosed herein that can implement the example semiconductor package of FIG. 1.

FIG. 5 is a partial, top view of another example glass substrate 502 disclosed herein. For example, the glass substrate 502 can be used to implement the semiconductor package 100 of FIG. 1. The glass substrate 502 is similar to the glass substrate 402 of FIGS. 4A-4C. For example, the glass substrate 502 includes a first signal line 202, a second signal line 204, and a shield 504. The shield 504 of the illustrated example includes a first shield 506 and a second shield 508. The first shield 506 is associated with and/or provides shielding to the first signal line 202 and the second shield 508 is associated with and/or provides shielding to the second signal line 204. The first shield 506 includes a first wall 410 and the second shield includes a second wall 420.

In the orientation of FIG. 5, a closed end 422b of the second wall 420 is oriented towards a first open end 412a of the first wall 410. In other words, the first open end 412a of the first shield 506 is oriented toward the closed end 422b of the second shield 408. This orientation is beneficial for use with signal-ended signals. In these examples, the closed ends 412b, 422b of one of the first shield 506 or the second shield 508 is oriented toward the other one of the open ends 412a, 422a of the first shield 506 or the second shield 508 to reduce crosstalk between the first signal line 202 and the second signal line 204. In the illustrated example, the first open end 412a of the first wall 410 and the open end 422a of the second wall 420 are oriented toward a side surface 510 of the glass substrate 502.

Figure 6:
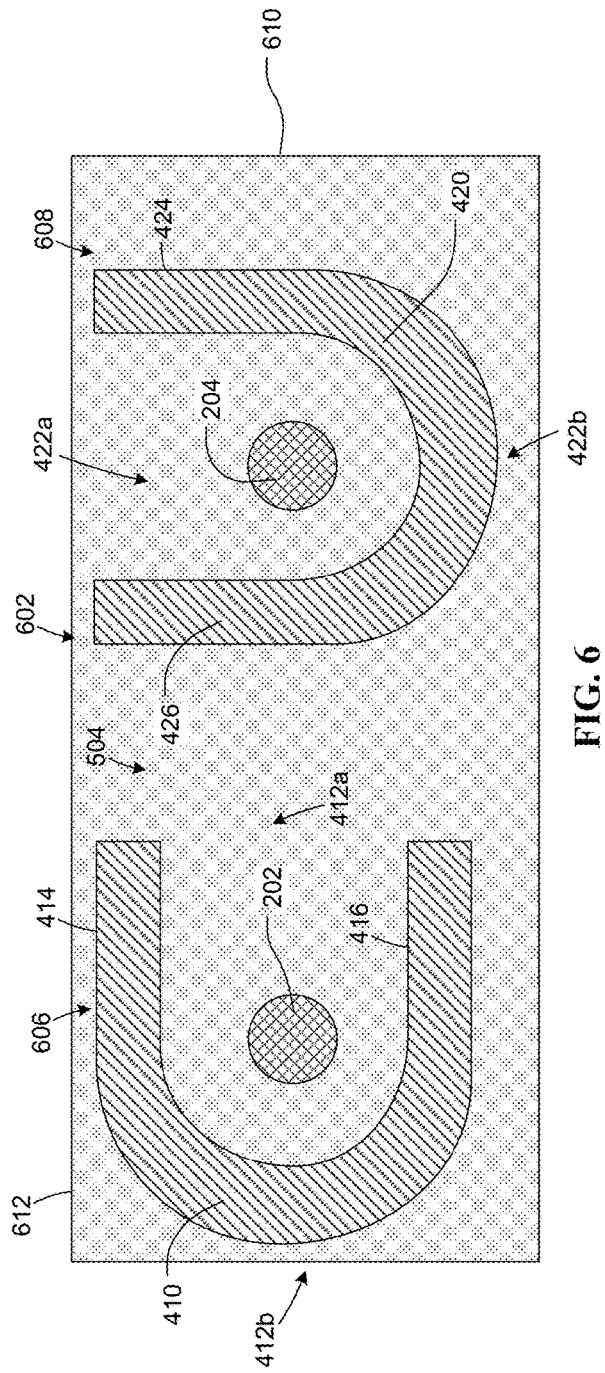
FIG. 6 is a partial, enlarged top view of another example glass substrate disclosed herein that can implement the example semiconductor package of FIG. 1.

FIG. 6 is a partial top view of another example glass substrate 602 disclosed herein. For example, the glass substrate 602 can be used to implement the semiconductor package 100 of FIG. 1. The glass substrate 602 is similar to the glass substrate 402 of FIGS. 4A-4C. For example, the glass substrate 602 includes a first signal line 202, a second signal line 204, and a shield 604. The shield 604 of the illustrated example includes a first shield 606 and a second shield 608. The first shield 606 is associated with and/or provides shielding to the first signal line 202 and the second shield 608 is associated with and/or to provide shielding to the second signal line 204. The first shield 606 includes a first wall 410 and the second shield 608 includes a second wall 420. In the orientation of FIG. 6, a first open end 412a of the first wall 410 is oriented towards a leg 426 of the second wall 420. In other words, the first open end 412a of the first shield 606 is oriented toward one of the legs 424, 426 of the second shield 408. This orientation is beneficial for use with signal-ended signals. In these examples, the legs 414, 416, 424, 426 of one of the first shield 606 or the second shield 608 is oriented toward the other one of the open end 412a, 422a of the first shield 606 or the second shield 608 to reduce crosstalk between the first signal line 202 and the second signal line 204. In the illustrated example, the first open end 412a of the first wall 410 is oriented toward a first surface 610 (e.g., a side surface) of the glass substrate 602, and the open end 422a of the second wall 420 is oriented toward a second surface 612, where the first surface 610 is perpendicular relative to the second surface 612. In other words, in the orientation of FIG. 6, the first wall 410 has a C-shape profile and the second wall 420 has a U-shape profile.

Figure 7A:
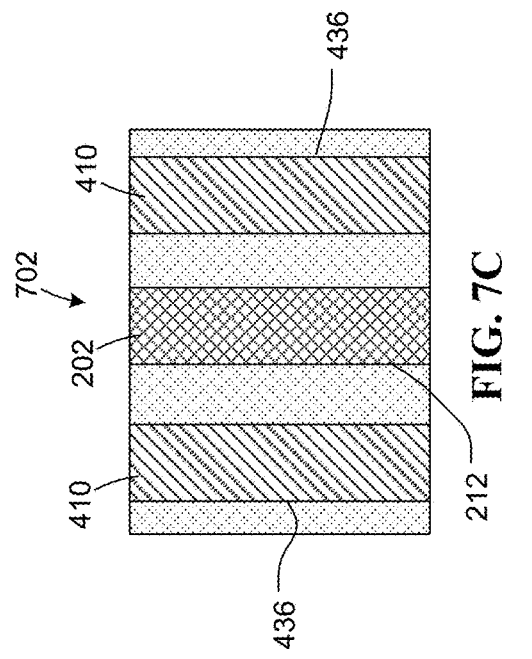
FIG. 7A is a partial, enlarged top view of another example glass substrate disclosed herein that can implement the example semiconductor package of FIG. 1.
Figure 7B:
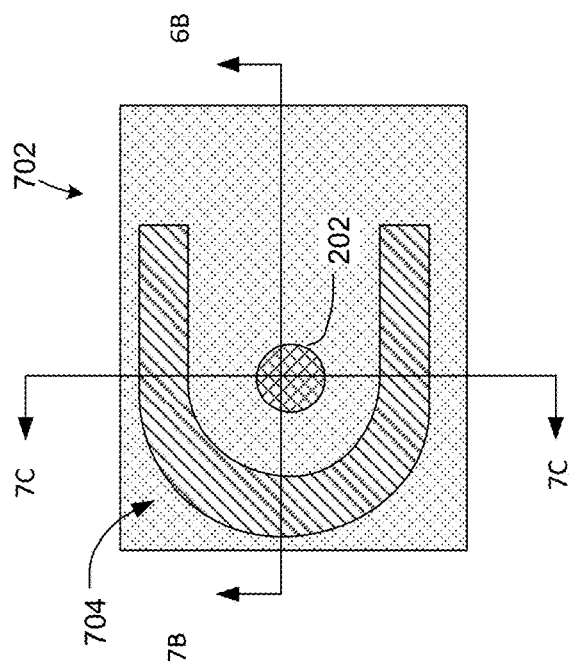
FIG. 7B is a cross-sectional view of the example glass substrate of FIG. 7A taken along line 7B-7B of FIG. 7A.
Figure 7C:
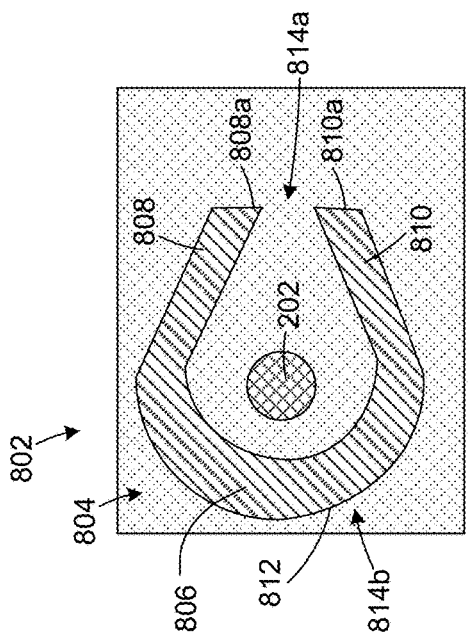
FIG. 7C is a cross-sectional view of the example glass substrate of FIG. 7A taken along line 7C-7C of FIG. 7A.

FIG. 7A is a partial, top view of another example glass substrate 702 disclosed herein. FIG. 7B is a cross-sectional view taken along lines 7B-7B of FIG. 7A. FIG. 7C is a cross-sectional view taken along lines 7C-7C of FIG. 7A. For example, the glass substrate 702 can implement the semiconductor package 100 of FIG. 1. The glass substrate 702 of the illustrated example is substantially similar to the glass substrate 402 of FIGS. 4A-4C. In contrast to the glass substrate 402 of FIGS. 4A-4C, the glass substrate 702 of the illustrated example includes a single shield 704. The single shield 704 includes a single wall 410 and a single signal line 202 (e.g., a single signal line). The conductive material 215 of the opening 212 provides a signal path of the first signal line 202 and the conductive material 215 positioned in the first channel 436 provides electromagnetic shielding for the signal path of the signal line 202 (e.g., a coaxial transmission line).

Figure 8:
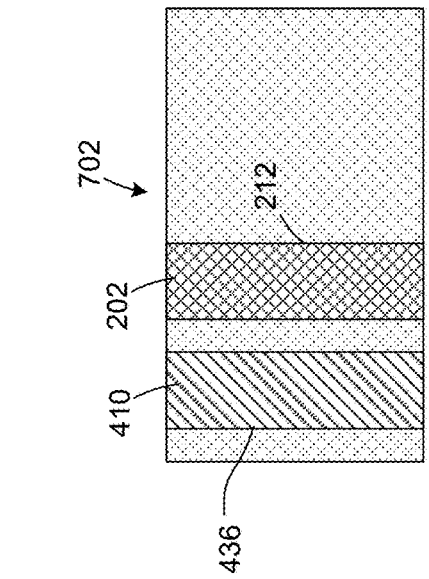
FIG. 8 is a partial, enlarged top view of another example glass substrate disclosed herein that can implement the example semiconductor package of FIG. 1.

FIG. 8 is a partial, top view of another example glass substrate 802 disclosed herein. For example, the glass substrate 802 can be used to implement the semiconductor package 100 of FIG. 1. The glass substrate 802 is similar to the glass substrate 402 of FIGS. 4A-4C and the glass substrate 702 of FIGS. 7A-7C. For example, the glass substrate 802 of the illustrated example includes a signal line 202 and a shield 804. The shield 804 of the illustrated example defines a wall 806 that partially encircles or surrounds the first signal line 202. The wall 806 of the illustrated example includes a first leg 808 defining a first end 808a, a second leg 810 defining a second end 810a, and an arcuate portion 812 between (e.g., interconnecting) the first leg 808 and the second leg 810. In contrast to the first wall 410 of FIGS. 4A-4C and 7A-7C, the first leg 808 and the second leg 810 of the illustrated example taper toward each other to define an open end 814a opposite a closed end 814b of the wall 806. In this manner, an area defined by the open end 814 (e.g., an area of an opening defined between the first end 808a and the second end 810a) is substantially smaller than an opening of the first open end 412a of FIGS. 4A-4C (e.g., an area defined between the first end 416a and the second end 418a of FIG. 4A). In the orientation of FIG. 8, the first leg 808 tapers toward the second leg 810 from the arcuate portion 812, and the second leg 810 tapers toward the first leg 808 from the arcuate portion 812. The first leg 808 and the second leg 810 of the illustrated example each has a straight or linear profile. However, in some examples, the first leg 808 and/or the second leg 810 can have a curved or arcuate shape.

The glass substrates 102, 302, 402, 502, 602, 702, and 802 and/or the semiconductor package 100 disclosed herein can be provided using conventional manufacturing techniques. For example, some example processes that can be used include laser etching, polishing, photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of semiconductor devices.

Figure 9:
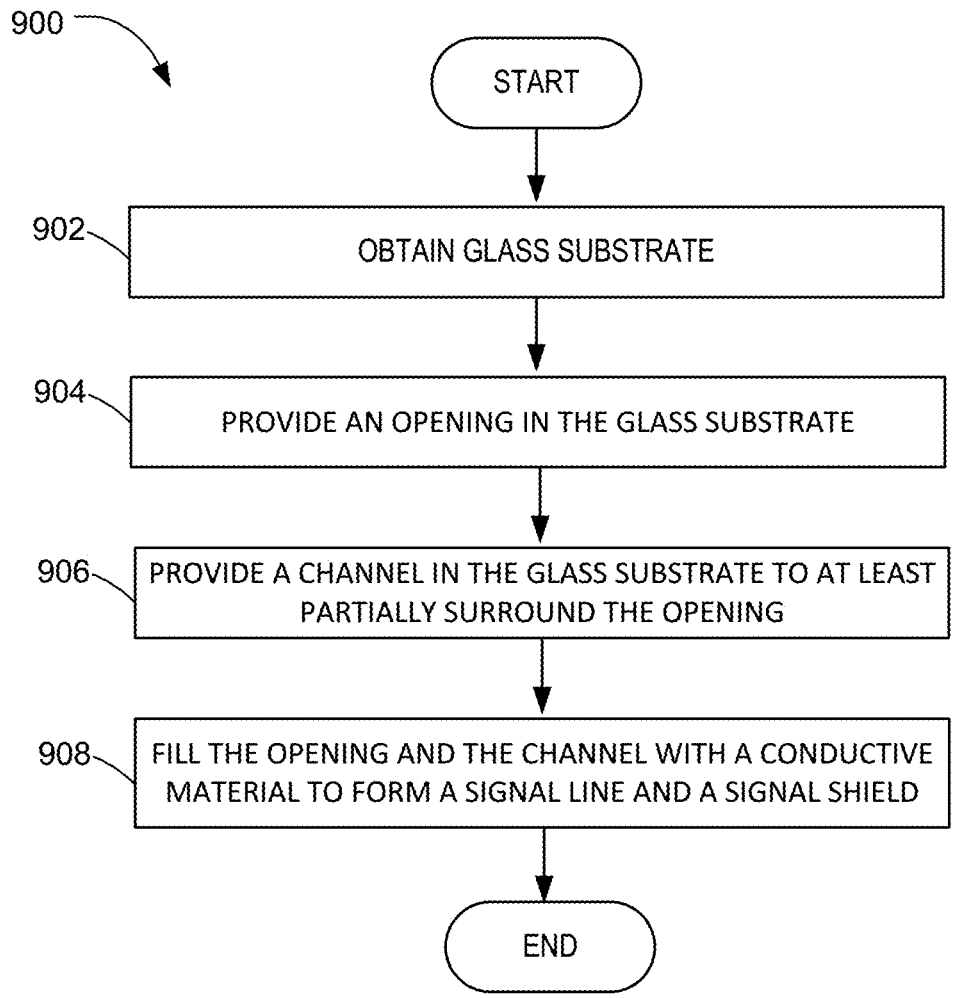
FIG. 9 is a flowchart of an example method of manufacturing an example semiconductor package disclosed herein.
Figure 10A:
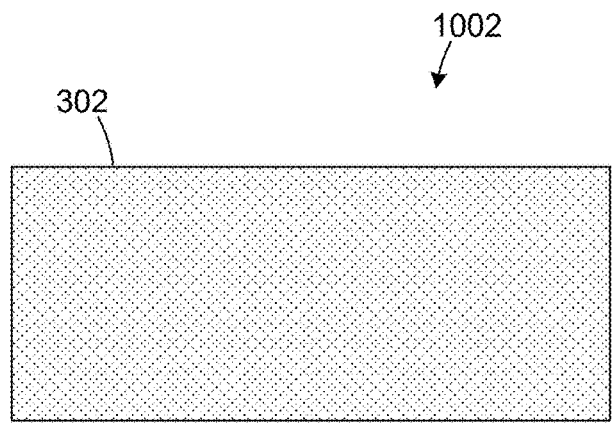
FIGS. 10A-10C depict the example glass substrate of FIGS. 3A-3C at various manufacturing stages corresponding to the example method of FIG. 9.
Figure 10B:
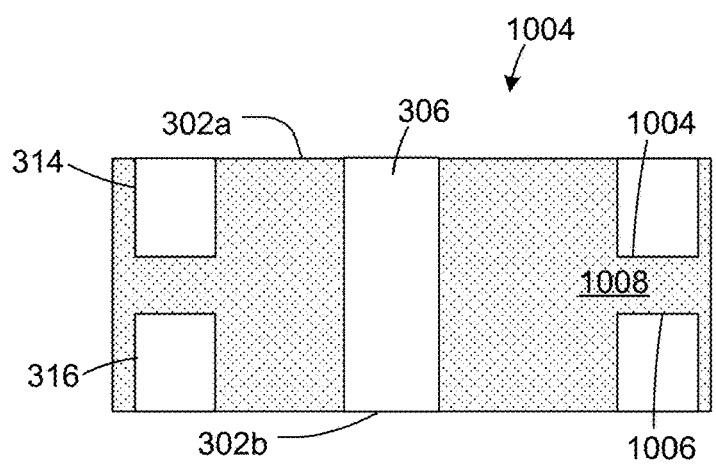
Figure 10C:
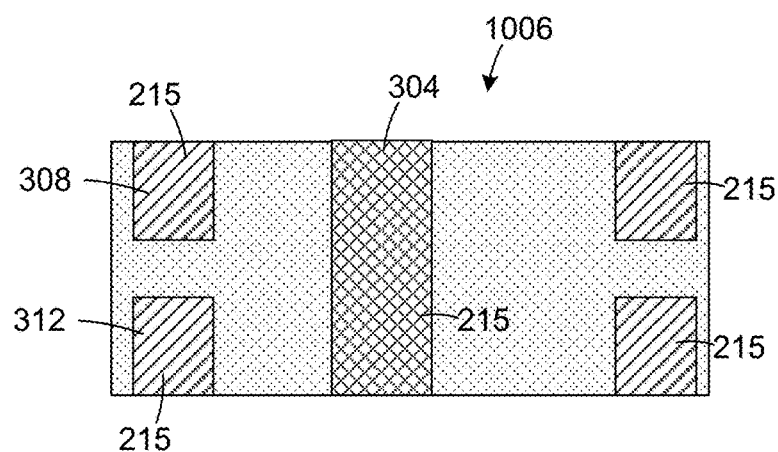

FIG. 9 is a flowchart of an example method 900 of fabricating an example semiconductor package having a glass substrate disclosed herein. For example, the method 900 of FIG. 9 can be used to fabricate or create the example semiconductor package 100 of FIGS. 1, 2A and 2B having an example glass substrate 102, 302, 402, 502, 602, 702, 802 disclosed herein. To facilitate discussion of the example method 900, the example method 900 will be described in connection with the example semiconductor package 100 and/or the glass substrate 302 of FIGS. A-3C. For example, FIGS. 10A-10C are cross-sectional schematic illustrations of the example glass substrate 102 of FIGS. 3A-3C at various manufacturing stages 1002, 1004, 1006, 1008, 1010 corresponding to the example method 900 of FIG. 9. While an example manner of fabricating the example glass substrate has been illustrated in FIGS. 9 and 10A-10C, one of the steps and/or processes illustrated in FIGS. 9 and 10A-10C may be combined, divided, re-arranged, omitted, eliminated and/or implemented in any other way. Further still, the example methods of FIGS. 9 and 10A-10C may include processes and/or steps in addition to, or instead of, those illustrated in FIGS. 9 and 10A-10C and/or may include more than one of any or all of the illustrated processes and/or steps. Further, although the example methods are described with reference to the flowcharts illustrated in FIGS. 9 and 10A-10C, many other methods or processes of fabricating electronic packages may alternatively be used.

Referring to the example method 900 of FIG. 9, the method 900 begins by obtaining a glass substrate (block 902). For example, referring to FIG. 10A, the glass substrate 302 can be obtained and can be composed of quartz or any other glass material(s).

An opening is provided in the glass substrate (block 904). For example, referring to FIG. 10B, the opening 306 (e.g., a TGV) is provided in the glass substrate 302 extending between (e.g., completely through) the first surface 302a of the glass substrate 102 and the second surface 302b of the glass substrate 302. The opening 306 can be a cylindrically shaped opening extending completely through the glass substrate 302 defining a TGV that can be provided in the glass substrate 302. Formation of the opening 306 and can be achieved by any appropriate process including, but not limited to, etching, by chemical and/or mechanical polishing, drilling (e.g., mechanical and/or laser drilling) and subsequent cleaning, and/or any other appropriate process for creating a trench or cavity. For example, the opening 306 can be created via a laser drilling processes (e.g., via a laser and a chemical (e.g., hydrofluoric acid)), through glass vias (TGVs) manufacturing techniques, and/or any other semiconductor manufacturing process.

Additionally, a channel is provided in the glass substrate to at least partially surround the opening (block 904). For example, referring to FIG. 10B, the first channel 314 is provided in the first surface 302a and the second channel 316 is provided in the second surface 302b. The first channel 226 partially extends inward from the first surface 302a. In other words, the first channel 314 does not extend completely through the glass substrate 302. Additionally, the second channel 316 partially extends inward from the second surface 302b. In other words, the second channel 316 does not extend completely through the glass substrate 302. In this manner, a gap 1002 is provided between respective base walls 1004, 1006 and a body 1008 of the glass substrate 302 is positioned between the respective second walls 1004, 1006.

The first channel 314 and/or the second channel 316 can be provided by selectively removing sections or material from the glass substrate 302. The removal of material from the glass substrate 302 can be achieved by any appropriate process, e.g., by etching, by chemical and/or mechanical polishing, using drilling (e.g., mechanical and/or laser drilling) and subsequent cleaning, and/or any other appropriate process for fabricating such a trench or cavity. For example, creation of the first channel 314 and the second channel 316 can be performed via a laser drilling processes (e.g., via a laser and a chemical (e.g., hydrofluoric acid)), and/or any other semiconductor manufacturing process.

For example, a laser can be applied to respective areas of the first surface 302a defining the first channel 314 and respective areas of the second surface 302b defining the second channel 316 to weaken, fracture or otherwise remove the areas of the glass substrate 302 (e.g., laser etching, laser drilling, etc.) that define the first channel 314 and the second channel 316. Subsequently, the glass substrate 302 can be exposed to a chemical (e.g., hydrofluoric acid) to further weaken and/or remove the areas of the glass substrate 302 to provide the first channel 314 and the second channel 316. In some examples, a photoresist layer can be applied to areas of the glass substrate 302 that do not require drilling and/or material removal. In other words, in some examples, a photoresist layer can be applied to areas of the first surface 302a and/or the second surface 302b that do not require material removal.

In some examples, the first channel 314, the second channel 316 and/or the opening 306 can be provided concurrently or via the same manufacturing method (e.g., via etching, laser drilling, mechanical abrasion, laser ablation, other material removal techniques and/or any other known semiconductor manufacturing technique(s)). In some examples, the glass substrate 302 is provided concurrently with the formation of the example semiconductor package 100 (e.g., the build-up layers 104).

After the opening and channel have been provided in the glass substrate, the opening is filled with a conductive material to provide a signal line and the channel is filled with the conductive material to provide a signal shield (block 910). The opening and the channels are filled with a conductive material concurrently or contemporaneously. For example, referring to FIG. 10C, the conductive material 215 can be positioned or filled in the first channel 314, the second channel 316 and/or the opening 306 using deposition or application technology including, but not limited to, photolithography, plating, electro-less plating, electrolytic plating, lamination, deposition techniques (such as atomic layer deposition or chemical vapor deposition), or similar techniques. In some examples, the first channel 314, the second channel 316 and/or the opening 306 can be filled with a conductive material (e.g., copper) via seeding and electroplating manufacturing processes.

Additionally, in some examples, after the first channel 314, the second channel 316 and/or the opening 306 are filled with the conductive material 215, the conductive material 215 can be polished to flush mount the conductive material 215 with the glass substrate 302. For example, the conductive material 215 in the first channel 314 and a first end of the opening 306 can be polished to flush mount the conductive material 215 relative to the first surface 302a and the conductive material 215 in the in the second channel 316 and a second end of the opening 306 can be polished to flush mount the conductive material 215 relative to the second surface 106b.

Optionally, if needed, in some examples, an opening can be provided in the shield of the glass substrate. For example, referring to FIG. 10B, in some examples, one or more openings 254 (similar to those shown in FIGS. 2A-2C) can be provided through the first channel 314 and the second channel 316 such that the opening extends fully between the first surface 302a and the second surface 302b of the glass substrate 302 (and through the body 1008 between the walls 1004, 1008. The openings 254 can be provided at any desired locations within the first channel 314 and the second channel 316. The openings 254, the first channel 314, the second channel 316 and the opening 306 can be filled (e.g., plated) with the conductive material 215 to define the first shield 308, the second shield 312, the signal line 304 and one or more stitch vias 252 (FIGS. 2A-2C) provided in the first shield 308 and the second shield 312.

Although not shown, other build-up layers 104 can be provided on the glass substrate 102 using conventional semiconductor manufacturing techniques or processes including, but not limited to, photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of semiconductor devices.

The foregoing examples of the glass substrates 102, 302, 402, 502, 602, 702, and 802 teach or suggest different features. Although each example glass substrate 102, 302, 402, 502, 602, 702, and 802 disclosed above has certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Example methods, apparatus, systems, and articles of manufacture to implement glass substrates for semiconductor packages are disclosed herein. Further examples and combinations thereof include the following:

Example 1 includes a semiconductor package including a core layer defining a channel and a TGV. The channel at least partially surrounding the TGV. A signal transmission line is provided in the TGV and extending through the core layer. An electrically conductive material positioned in the channel, the conductive material to provide electromagnetic shielding to the transmission line.

Example 2 includes the semiconductor package of example 1, where the core layer has a thickness between a first surface of the core layer and a second surface of the core layer, the first surface opposite the second surface.

Example 3 includes the semiconductor package of examples 1 or 2, where the channel is provided at the first surface and at least partially extends between the first surface and the second surface, the channel being offset inwardly from the first surface in a direction away from the first surface and toward the second surface.

Example 4 includes the semiconductor package of any one of examples 1-3, where the channel is a continuous trench.

Example 5 includes the semiconductor package of any one of examples 1-4, where the channel has an oblong shape.

Example 6 includes the semiconductor package of any one of examples 1-5, further including a plurality of vias provided in the core layer and extending through the channel.

Example 7 includes the semiconductor package of any one of examples 1-6, where the vias are at least one of plated or filled with a conductive material.

Example 8 includes the semiconductor package of any one of examples 1-7, where the channel completely surrounds the signal transmission line.

Example 9 includes the semiconductor package of any one of examples 1-8, where the channel includes a first channel portion partially surrounding signal transmission line.

Example 10 includes the semiconductor package of any one of examples 1-9, where the channel is provided at the first surface and extends completely through the core layer between the first surface and the second surface.

Example 11 includes the semiconductor package of any one of examples 1-10, where the trench portion has a c-shape.

Example 12 includes the semiconductor package of any one of examples 1-11, where the trench includes a first trench portion and a second trench portion, the first trench portion is separate and spaced from the second trench portion, and wherein the signal transmission line includes a first signal line and a second signal line separate from the first signal line, the first trench portion partially surrounding the first signal line and the second trench portion partially surrounding the second signal line.

Example 13 includes a semiconductor package including a glass substrate having an opening extending between a first surface of the glass substrate and a second surface of the glass substrate, the glass substrate having a trench at least partially surrounding the opening. A conductive material is positioned in the opening and the trench, the conductive material positioned in the opening to provide a signal path and the conductive material positioned in the trench to provide electromagnetic shielding for the signal path Example 14 includes the semiconductor package of example 13, where the trench is provided in the first surface and partially extends toward the second surface.

Example 15 includes the semiconductor package of examples 13 or 14, where the trench is a continuous trench and completely surrounds the signal path.

Example 16 includes the semiconductor package of any one of examples 13-15, where the trench is provided in the first surface and completely extends from the first surface to the second surface.

Example 17 includes the semiconductor package of any one of examples 13-16, where the trench is a non-continuous trench and only partially surrounds the signal path.

Example 18 includes a method including providing an opening in the glass substrate, providing a trench in a glass substrate, the trench to at least partially surround the opening, filling the opening with a conductive material to define a signal line, and filling the trench with the conductive material to provide an electromagnetic shield in the glass substrate to restrict electrical interference with the signal line.

Example 19 includes the method of example 18, further including creating the trench to completely surround the opening.

Example 20 includes the semiconductor package of examples 18 or 19, further including creating the trench to partially surround the opening.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A semiconductor package comprising:
   a core layer including:
      a first channel partially extending through a first surface of the core layer;
      a second channel partially extending through a second surface of the core layer opposite the first surface, the second channel spaced from the first channel to provide a separation within the core layer between the first channel and the second channel; and
      a through glass via (TGV), the first channel and the second channel at least partially surrounding the TGV;
   a signal transmission line in the TGV and extending through the core layer; and
   an electrically conductive material in the first channel and the second channel, the electrically conductive material to provide electromagnetic shielding to the signal transmission line.

2. The semiconductor package of claim 1, wherein the core layer has a thickness between the first surface of the core layer and the second surface of the core layer, wherein the separation between the first channel and the second channel is less than the thickness.

3. The semiconductor package of claim 2, wherein the first channel extends inwardly in a direction toward the second surface.

4. The semiconductor package of claim 3, wherein at least one of the first channel or the second channel includes a continuous trench.

5. The semiconductor package of claim 3, wherein at least one of the first channel or the second channel has an oblong shape.

6. The semiconductor package of claim 3, including a plurality of vias in the core layer and extending through the first channel and the second channel.

7. The semiconductor package of claim 6, wherein the vias are at least one of plated or filled with the conductive material.

8. The semiconductor package of claim 2, wherein the first channel and the second channel completely surround surrounds the signal transmission line.

9. A semiconductor package comprising:
a glass substrate having:
a first opening extending between a first surface of the glass substrate and a second surface of the glass substrate; and
a first trench partially surrounding the first opening, the first trench having a first leg having a first end, a second leg having a second end, and a third leg interconnecting the first leg and the second leg, the first end spaced from the second end in a first direction across the first surface of the glass substrate, the glass substrate between the first end and the second end; and
a conductive material in the first opening and in the first trench, the conductive material in the first opening to provide a first signal path and the conductive material in the first trench to provide electromagnetic shielding for the first signal path.

10. The semiconductor package of claim 9, wherein the first trench is in the first surface and completely extends from the first surface to the second surface.

11. The semiconductor package of claim 9, wherein the first trench is a non-continuous trench and only partially surrounds the first signal path.

12. A method for fabricating a semiconductor package comprising:
providing an opening in a glass substrate;
providing a first trench partially extending through a first surface of the glass substrate, the first trench having a first wall, a second wall and a third wall connecting the first wall and the second wall, the first trench to at least partially surround the opening;
providing a second trench partially extending through a second surface of the glass substrate opposite the first surface, the second trench having a fourth wall, a fifth wall and a sixth wall, the sixth wall of the second trench spaced from the third wall of the first trench in a direction between the first surface and the second surface to provide a gap between the first trench and the second trench, the glass substrate extending within the gap between the first trench and the second trench;
filling the opening with a conductive material to define a signal line; and
filling the first trench and the second trench with the conductive material to provide an electromagnetic shield in the glass substrate to restrict electrical interference with the signal line.

13. The method of claim 12, further including creating the first trench and the second trench to completely surround the opening.

14. The semiconductor package of claim 1, wherein the first channel is defined by a first wall, a second wall and a third wall connecting the first wall and the second wall, and the second channel is defined by a fourth wall, a fifth wall and a sixth wall connecting the fourth wall and the fifth wall, the sixth wall of the second channel opposing the third wall of the first channel, the sixth wall spaced from the third wall.

15. The semiconductor package of claim 9, wherein the glass substrate includes a second opening between the first surface of the glass substrate and the second surface of the glass substrate, the second opening spaced from the first opening.

16. The semiconductor package of claim 15, including a second trench at least partially surrounding the second opening, the second trench having a fourth leg with a third end, a fifth leg having a fourth end, and a sixth leg interconnecting the fourth leg and the fifth leg, the third end spaced from the fourth end in the first direction across the first surface of the glass substrate, the glass substrate between the third end of the second trench and the fourth end of the second trench.

17. The semiconductor package of claim 16, wherein the first trench is electrically isolated from the second trench.

18. The semiconductor package of claim 16, wherein the glass substrate is between the first and second ends of the first trench and the third and fourth ends of the second trench.

19. The semiconductor package of claim 16, including the conductive material in the second opening to provide a second signal path, and including the conductive material in the second trench to provide electromagnetic shielding for the second signal path.

20. The semiconductor package of claim 9, wherein the first trench has a c-shape.

* * * * *